United States Patent [19]

Arai et al.

[11] Patent Number: 5,010,232
[45] Date of Patent: Apr. 23, 1991

[54] METHOD OF AND APPARATUS FOR PERFORATING PRINTED CIRCUIT BOARD

[75] Inventors: Kunio Arai, Atsugi; Yasuhiko Kanaya, Machida, both of Japan

[73] Assignee: Hitachi Seiko, Ltd., Ebina, Japan

[21] Appl. No.: 468,914

[22] Filed: Jan. 23, 1990

[30] Foreign Application Priority Data

Jan. 27, 1989 [JP] Japan ............................ 01-016157

[51] Int. Cl.⁵ ............................................ B23K 26/00
[52] U.S. Cl. ............................ 219/121.7; 219/121.67; 219/121.31
[58] Field of Search ........... 219/121.6, 121.70, 121.71, 219/121.67, 121.72, 121.85

[56] References Cited

U.S. PATENT DOCUMENTS

| | | | |
|---|---|---|---|
| 4,335,296 | 6/1982 | Bredow | 219/121.67 |
| 4,504,727 | 3/1985 | Melcher et al. | 219/121.62 |
| 4,644,130 | 2/1987 | Bachmann | 219/121.69 |
| 4,857,696 | 8/1989 | Taenich et al. | 219/121.7 |

FOREIGN PATENT DOCUMENTS 0064097 4/1983 Japan .

OTHER PUBLICATIONS

F. W. Haning et al., "IBM Technical Disclosure Bulletin", *Laminate Fabrication to Facilitate Laser Drilling*, vol. 17, No. 18, p. 2258, Jun. 1975.

J. J. Hillebrand, "Feinwerktechnik and Messtechnik", *Laserbohren in Organischen Leitenplatten–Material*, 91 (1983), pp. 56–58.

Primary Examiner—C. L. Albritton

[57] ABSTRACT

A method of perforating a printed circuit board having a copper foil layer on one side thereof, at least one intermediate resin layer and a layer on the other side thereof, so as to form a connection hole for providing an electrical connection between the copper foil layer and the layer on the other side of the printed circuit board. The method employs a printed circuit board perforation apparatus which has a laser processing head capable of processing the printed circuit board by means of a laser beam and a drill head capable of driling the printed circuit board. After the apparatus is suitably located with respect to the printed circuit board, the drilling head operates to conduct drilling into the resin layer through the copper foil layer by the drilling head so as to form a pilot hole. Then, the pilot hole is located with respect to the laser processing head and the laser processing head operates to irradiate a laser beam to the portion of the resin layer remaining at the bottom of the pilot hole so as to remove the resin, thereby forming the connection hole reaching the layer on the other side of the printed circuit board. An apparatus for carrying out this method is also disclosed.

14 Claims, 5 Drawing Sheets

F I G. 1(a)
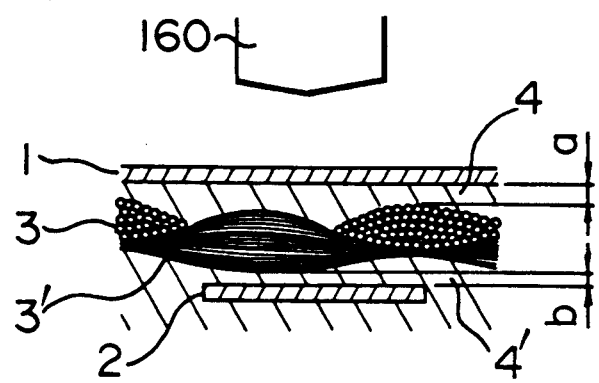
F I G. 1(b)
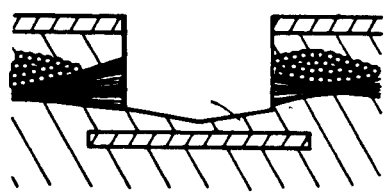
F I G. 1(c)
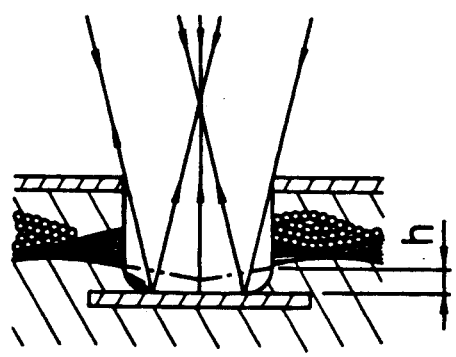

(a)

METHOD OF AND APPARATUS FOR PERFORATING PRINTED CIRCUIT BOARD

BACKGROUND OF THE INVENTION

The present invention relates to a method of and an apparatus for perforating a printed circuit board. More particularly, the present invention is concerned with a method of and an apparatus for forming connection holes in a multi-layered printed circuit board for providing electrical connections between internal wiring patterns and wiring patterns on the surface of the printed circuit board.

Japanese Patent Unexamined Publication No. 58-64097, for example, discloses a method of forming connection holes in a printed circuit board for the purpose of providing electrical connections between internal wiring patterns and wiring patterns on the surface of the printed circuit board.

In this method, pilot holes are formed by etching in portions of the outer copper foil layer where the connection holes are to be formed. The pilot holes have a diameter slightly smaller than that of a $CO_2$ gas laser beam which is to be used for forming the connection holes. Namely, the $CO_2$ gas laser beam is applied through these pilot holes to remove portions of the resin layers around the etched pilot holes thereby forming the connection hole.

This perforating process includes steps of etching, perforation, plating and etching. Thus, etching is conducted twice so that the efficiency of the work is impaired undesirably.

Furthermore, since the etching for forming the pilot holes and the perforation for forming the connection holes are conducted in separate steps, the precision may be impaired seriously due to accumulation of errors incurred during these steps. Namely, the shape of the connection holes tends to fluctuate due to deviation of the perforating laser beam from the position of the pilot hole formed by etching. In consequence, the area of electrical contact is undesirably reduced at the bottom of the connection hole, with the result that the reliability of the electrical connection between the external wiring pattern and the internal wiring pattern is reduced.

For instance, when a connection hole having an opening diameter of 150 μm in the outer layer and a bottom diameter of 100 to 120 μm is to be formed, the bottom diameter of the connection hole may be reduced to 50 to 70 μm if the deviation of the laser beam is 50 μm or greater, with the result that the reliability of the electrical connection is impaired seriously.

FIG. 5 schematically illustrates the process steps in a conventional method for perforating a printed circuit board.

FIG. 5(a) shows the structure of a typical known printed circuit board. The printed circuit board has an outer copper foil layer 1, an inner copper foil layer 2, cloth layers 3, 3' formed of bundles of glass fibers, and resin layers 4, 4', 4''. In order to ensure sufficiently large bonding strengths between the outer and inner copper foil layers 1, 2 and the resin layers 3, 3', 4, 4', 4'', bonding resin regions of thicknesses $a$ and $b$ essentially exist in the boundaries between these layers. Numeral 5 denotes a pilot hole formed by etching for a subsequent irradiation with a laser beam.

Portions of the glass fiber layers 3, 3' and the resin layers 4, 4', 4' in the region around the pilot hole 5 are removed by the subsequent application of the laser beam. The amounts of removal of the glass fiber layers and the resin layers, however, are not equal because of various factors such as the energy absorption capacity, rate of absorption of energy, difference in the energy density between the in-focus position and the out-of-focus position, difference in the irradiation time, and so forth. For instance, it is assumed here that the laser beam is a Gauss beam and focused on the surface of the inner layer through the resin layer to be removed having a considerably large thickness H. In such a case, although the bottom portion of the connection hole is finished satisfactorily, defects such as carbonization of the resin, projection of glass fibers in an acicular form at a height of $W_1$ and so forth are encountered in the surface region of the resin around the inlet opening of the connection hole, as shown in FIGS. 5(b) and 5(c). In the worst case, a bulk of glass fibers of a large size undesirably remain on the surface of the hole as denoted by 6. These defects are attributable to the fact that the surface region of the resin is removed taking an intermediate step of melting rather than by sublimation, because such region is subjected for a long time to a beam of a lower energy density than the bottom region.

When the laser beam is applied for a long time, a problem is encountered in the steps shown in FIGS. 5(a) and 5(b) in that the resin is undesirably recessed as indicated at $W_2$ due to reflection and diffusion of the laser beam at the surface of the inner copper foil layer which has been made acicular for the purpose of plating precipitation. Too long irradiation time also poses a problem in that the resin 4'' which is evaporated at the center of the bottom of the hole due to excess beam energy undesirably raises the inner foil layer. In addition, carbonization of the resin 4'' also was caused.

The carbonized portion of the resin on the wall of the hole can be removed by a suitable chemical processing. Such a chemical processing, however, undesirably allows the glass fibers to project from the resin in greater amounts, thereby making it difficult to impregnate the hole wall with a plating solution, with the result that the reliability of the connection formed by the plating through the connection hole is seriously impaired. In addition, it is impossible to remove the carbonized portion of the resin 4''. In order to obviate these problems, it has been proposed to use a special resin material instead of the glass fibers to enable perforation by a laser beam. Printed circuit board employing such a special resin material, however, could not be used practically because of inferior physical properties as compared with conventional printed circuit boards.

In addition, the conventional method could not be applied to formation of connection hole in the inner copper foil layer of a multi-layered printed circuit board of the type shown in FIG. 2(b), because the laser beam is reflected by the inner copper foil layer.

SUMMARY OF THE INVENTION

Accordingly, an object of the present invention is to provide a method which enables an efficient formation of reliable connection holes in a printed circuit board, thereby overcoming the above-described problems of the prior art.

To this end, the present invention provides a method of perforating a printed circuit board which employs a printed circuit board perforation apparatus provided both with a laser processing head for processing a printed circuit board by means of a laser beam and a drilling head for performing a drilling on the printed circuit board.

More specifically, the copper foil layer facing the laser processing head and the drilling head and the resin layer under this copper foil layer is drilled by the drilling head to a level slightly above the level of the surface of the inner copper foil layer so that a pilot hole is formed and, thereafter, the laser processing head is located with respect to the pilot hole and applies a laser beam to remove remaining portion of the resin layer thereby forming a connection hole which reaches the surface of the inner copper foil layer.

BRIEF DESCRIPTION OF THE DRAWINGS

FIGS. 1(a)–1(c), 2(a)–2(c) and 3(a)–3(d) are illustrations of a method of the invention for perforating a printed circuit board to form connection holes;

DESCRIPTION OF THE PREFERRED EMBODIMENTS

A preferred embodiment of the present invention will be described hereinunder with reference to FIGS. 1 to 4.

Figure 4:
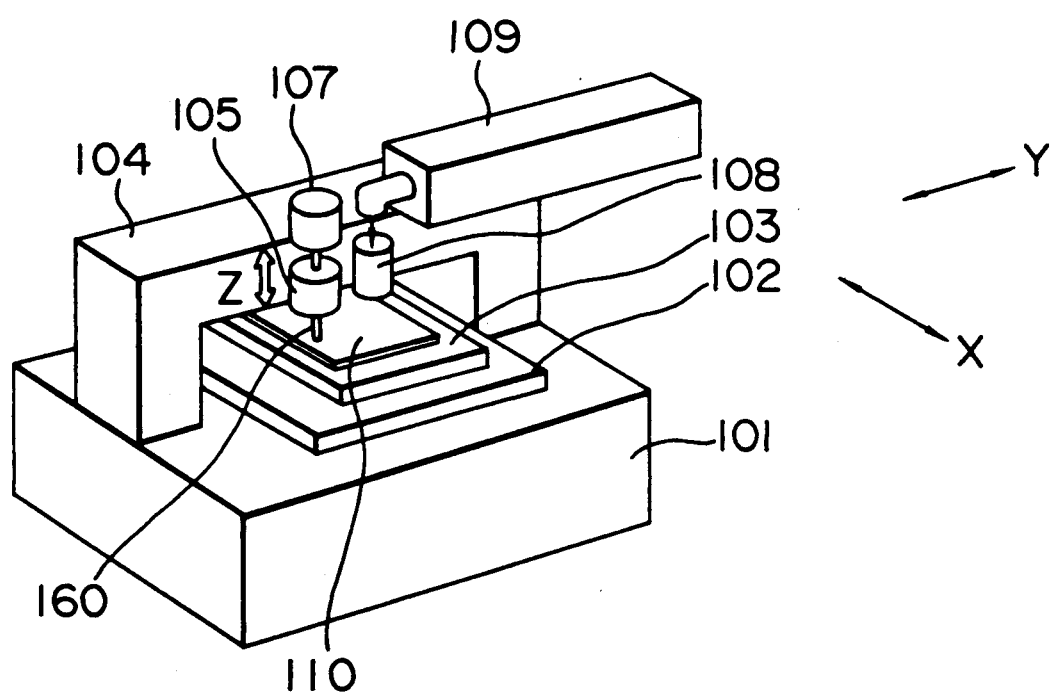
FIG. 4 is a perspective view of a printed circuit board perforation apparatus suitable for use in carrying out the of the present invention.
Figure 5A:
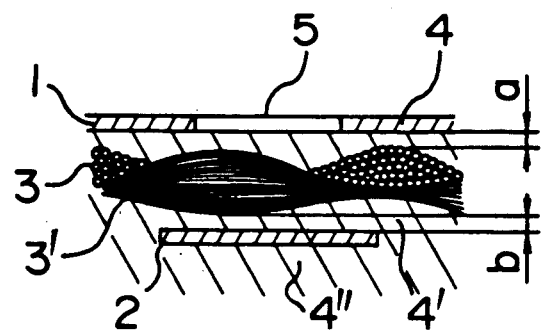
FIGS. 5(a)–5(c) are illustration of the process steps in a conventional method for perforating a printed circuit board.
Figure 5B:
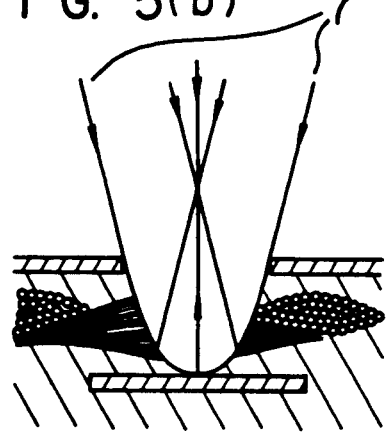
Figure 5C:
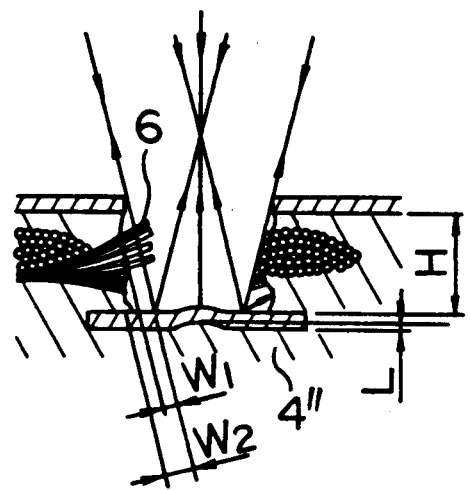

FIG. 4 shows an example of apparatus which is suitable for use in carrying out the method of the present invention. The apparatus has a bed 101, an X-table 102 mounted on the bed 101 for movement in the direction of an arrow X, a Y-table 103 mounted on the X-table 102 for movement in the direction of an arrow Y, and a column 104 is fixed to the bed 101 in such a manner as to straddle over the X- and Y-tables 102, 103. The apparatus also has a drilling head 105 which is fixed to a predetermined portion of the column 104. The drilling head 105 has a spindle carrying a drill 160 and supported rotatably and for movement in the direction of an arrow Z. Numeral 107 denotes a motor for feeding the spindle in the direction of the arrow Z. The apparatus further has a laser processing head 108 which is fixed to the column 104 at a predetermined distance from the drilling head 105. A laser oscillator 109 is fixed to a predetermined portion of the column 104. A printed circuit board 110 to be perforated is stationed on the Y-table 103.

Using this printed circuit board perforation apparatus, a perforating process is conducted in a manner shown in FIG. 3.

Namely, the X- and Y-tables 102, 103 are suitably driven to bring the portion of the printed circuit board 110 to be perforated to a position right below the drill 160 held by the spindle of the drilling head 105.

Figure 2A:
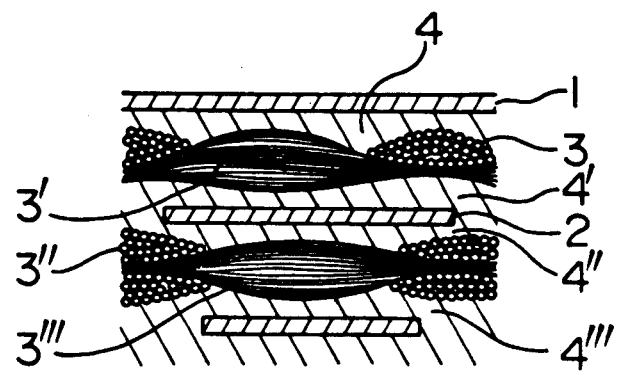
Figure 2B:
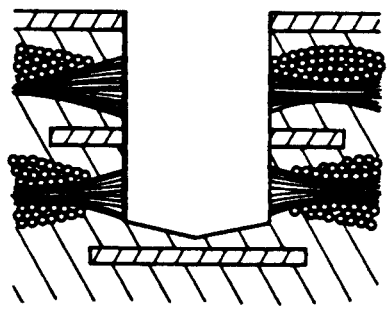
Figure 2C:
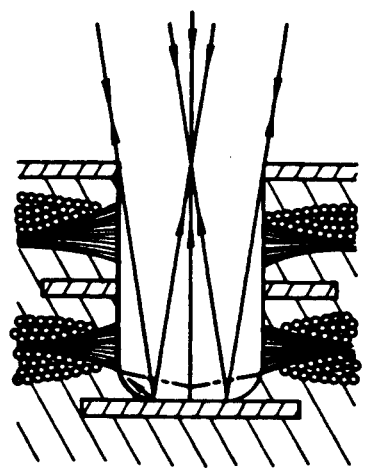
Figure 3A:
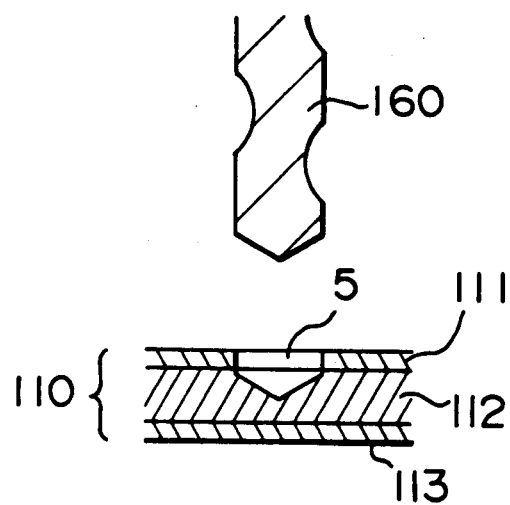
Figure 3B:
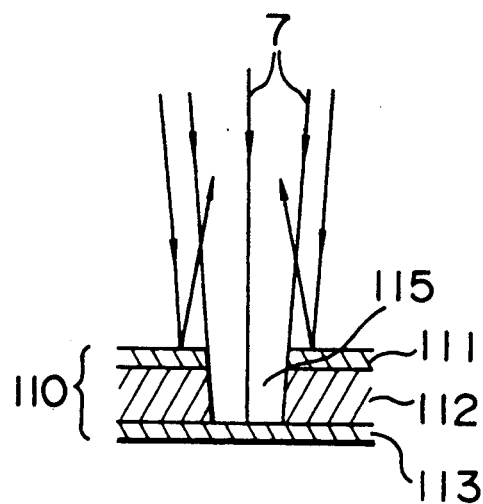

Then, the drill 160 is lowered to drill the copper foil layer on the upper side of the printed circuit board 110 so as to form a pilot hole 5 as shown in FIG. 3(a). Subsequently, the X- and Y-tables 102, 103 are moved to bring the pilot hole 5 to a position immediately under the laser processing head 108. The laser oscillator 109 is then activated to enable the laser processing head 108 to apply a laser beam 7 as shown in FIG. 3(b), thereby removing the resin material of the resin layer 112 of the printed circuit board 110, whereby a connection hole 115 is formed in the printed circuit board 110.

According to this perforation method, the laser beam 7 can be located with respect to the pilot hole 5 at a very high precision, e.g., about 10 $\mu$m or less in terms of error, which is attainable without difficulty by the printed circuit board perforation apparatus.

Figure 3C:
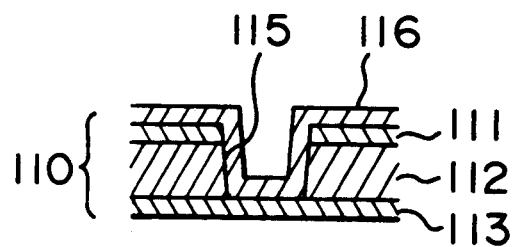
Figure 3D:
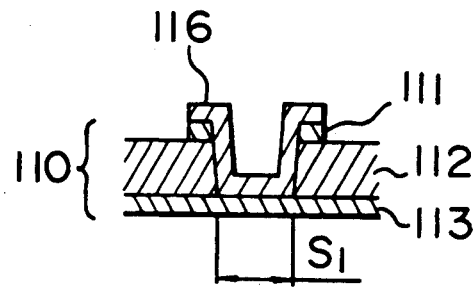

Subsequently, a plating is conducted in the thusformed connection hole 115 in a manner shown in FIG. 3(c) so as to form a conductor layer 116 which electrically connects the copper foil 111 on the upper side of the printed circuit board to the copper foil 113 on the lower side of the same. Subsequently, wiring patterns are formed by conducting etching as shown in FIG. 3(d).

It is assumed here that the connection hole 115 is to be formed to have command diameters of 150 $\mu$m and 100 to 120 $\mu$m at the inlet, i.e., at the opening appearing in the outer layer 111, and at the bottom of the hole, respectively. Since the deviation of the laser beam 7 from the pilot hole 5 is as small as 10 $\mu$m or less, any reduction in the diameter of the connection hole 115 at the bottom of the hole can be diminished to be 5% or less, thus ensuring a high reliability of the conductor layer 116 as the electrical connector.

The method of the present invention employs a printed circuit board perforation apparatus which is equipped both with a drilling head and a laser processing head. The apparatus operates, as shown in FIGS. 1(a)–5(c) and FIGS. 2(a)–2(c), first with the drill 160 to drill not only the outer copper foil layer but also the resin layers under the outer copper foil layer to a level slightly above the surface of the inner copper foil layer thus removing the glass fibers 3, 3' and the resin 4, while leaving only the portion of the resin 4' of a thickness h undrilled, thus forming a pilot hole. The laser beam is then applied to this undrilled portion of the resin 4' which forms the bottom of the pilot hole. The irradiation with the laser beam is conducted in quite a short time in in-focus state which provides the highest energy concentration, thereby substantially eliminating defects encountered with known methods such as acicular exposure and generation of a bulk of the glass fibers on the hole surface after processing by the laser beam. When the laser beam is a Gauss beam, the resin material at the corner of the hole is removed in a rounded manner as shown in FIG. 1(c), by virtue of diffraction of the beam and the reflective diffusion of the beam caused by the inner copper foil layer, whereby the wall of the hole is uniformly finished without recessing at the bottom of the hole. This facilitates permeation of the plating solution so that the plating can be conducted satisfactorily. In addition, problems such as evaporation and carbonization of the resin 4", as well as undesirable deformation of the inner copper foil, can be eliminated advantageously, thus offering a highly reliable perforation by the laser beam.

As has been described, according to the present invention, it is possible to enhance the perforating precision thereby remarkably improving the reliability of the electrical connection, thanks to the use of a printed circuit board perforation apparatus which is provided both with a drilling head and a laser processing head. Furthermore, the present invention makes it possible to successfully apply a laser perforation technique not only to conventional printed circuit board but also to multi-layered printed circuit board for accomplishing electrical connection between a plurality of inner wiring layers. In addition, the present invention offers a remarkable improvement in the production efficiency because of elimination of the etching for forming pilot holes.

What is claimed is:

1. A method of perforating a printed circuit board having a copper foil layer on one side thereof, at least one intermediate resin layer and a layer on the other side thereof, so as to form a connection hole for providing an electrical connection between said copper foil layer and said layer on the other side of said printed circuit board, said method comprising:

preparing a printed circuit board perforation apparatus which has a laser processing head capable of processing said printed circuit board by means of a laser beam and a drill head capable of drilling said printed circuit board;

conducting drilling into said resin layer through said copper foil layer by said drilling head so as to form a pilot hole; and irradiating through said pilot hole a laser beam by said laser processing head to the portion of said resin layer remaining at the bottom of said pilot hole so as to remove the resin, thereby forming said connection hole reaching said layer on the other side of said printed circuit board.

2. A method according to claim 1, wherein said layer on the other side of said printed circuit board is a copper foil layer and said connection hole reaching said copper foil layer is formed in said printed circuit board.

3. A method according to claim 1 or 2, wherein as means for forming said pilot hole said drilling is conducted to remove said outer copper foil layer and said resin layer to a level slightly above the level of the surface of said inner copper foil layer and then the remaining portion of said resin layer is removed by a laser beam.

4. An apparatus for perforating a printed circuit board comprising table means for moving said printed circuit board in X- and Y-directions, a drill head for drilling said printed circuit board, a laser processing head movable in Z-direction for processing said printed circuit board by means of a laser beam, a laser oscillator and a column for supporting said drill head, said laser processing head and said laser oscillator.

5. An apparatus for perforating a printed circuit board having at least one copper foil layer, comprising a shaping head which includes a drill head for shaping perforations in the printed circuit board and a laser further shaping the perforations head movable in a Z-direction for processing the printed circuit board.

6. An apparatus according to claim 5, further comprising a positioning element for the printed circuit board, which element includes a first table for moving the board in an X-direction orthogonal to the Z-direction, and a second table for moving the board in a Y-direction orthogonal to the X- and Z-directions.

7. An apparatus according to claim 6, wherein the shaping head is fixed relative to the positioning element in the X- and Y-directions.

8. A method of perforating a printed circuit board having at least one copper foil layer, comprising the steps of first shaping a perforation in the board to a position above a copper foil layer so as to leave a portion of the board remaining above the copper foil layer, and second shaping the perforation in the board with a laser beam to remove the remaining portion of the board with minimum deviation from the previously shaped perforation.

9. A method according to claim 8, wherein the board includes glass fibers between outer surfaces of the board, and the first shaping step includes shaping the perforation through the glass fibers to leave the remaining portion.

10. A method according to claim 9, wherein the second shaping step polishes the perforation up to the copper foil layer above which the remaining portion of the board is shaped.

11. A method according to claim 10, wherein the copper foil layer above which the remaining portion is left by the first shaping step is an outer layer.

12. A method according to claim 10, wherein the copper foil layer above which the remaining portion is left by the first shaping step is an inner layer between outer surfaces of the board.

13. A method according to claim 10, wherein the copper foil layer above which the remaining portion is left by the first shaping step is one of several inner layers between outer surfaces of the board.

14. A method according to claim 8, wherein the first shaping step is drilling of the perforation.

* * * * *